United States Patent
Harvey et al.

(10) Patent No.: US 6,466,895 B1
(45) Date of Patent: Oct. 15, 2002

(54) DEFECT REFERENCE SYSTEM AUTOMATIC PATTERN CLASSIFICATION

(75) Inventors: Stefanie Harvey; Terry Reiss, both of San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 190 days.

(21) Appl. No.: 09/586,540

(22) Filed: May 31, 2000

Related U.S. Application Data

(60) Provisional application No. 60/144,129, filed on Jul. 16, 1999.

(51) Int. Cl.$^7$ .............................................. G06F 3/00
(52) U.S. Cl. ........................ 702/181; 702/84; 702/117; 702/118
(58) Field of Search ..................... 702/118, 84, 117, 702/181, 33, 34, 35, 36, 40, 81–83, 120, 122, 183, 188; 382/149; 716/1

(56) References Cited

U.S. PATENT DOCUMENTS

| | | | |
|---|---|---|---|
| 5,751,582 A | * 5/1998 | Saxena et al. | 364/468.16 |
| 6,154,714 A | * 11/2000 | Lepejian | 702/118 |
| 6,215,896 B1 | * 4/2001 | Greig et al. | 382/149 |
| 6,324,481 B1 | * 11/2001 | Atchison et al. | 702/84 |

* cited by examiner

*Primary Examiner*—Marc S Hoff
*Assistant Examiner*—Felix Suarez
(74) *Attorney, Agent, or Firm*—McDermott, Will & Emery LLP

(57) ABSTRACT

A methodology is provided for qualitatively identifying features of an article, such as defects on the surface of a semiconductor substrate, with a string of symbols, such as numbers, according to relevant defect characteristics and information relating to the processing tools visited by the wafer, including reliability information. Embodiments include generalizing, after a defect on a wafer is discovered and inspected (as by optical review, SEM, EDS, AFM, etc.), each quantitative attribute of the defect such as the defect's size, material composition, color, position on the surface of the wafer, etc. into a qualitative category, assigning a numerical symbol to each attribute for identification, and sequencing the symbols in a predetermined manner. The identification sequences of all defects are stored in a database, where they are easily compared with other correspondingly identified defects. The identification sequence also includes a number representative of the wafer's last-visited processing tool, thereby associating the defect with a tool. After the defect is investigated and determined as being caused by a particular fault of the tool, this information is stored and linked to the defect's identification sequence. Thereafter, if a similar defect occurs in another wafer, the later defect's identification sequence is matched to that of the previous defect by searching the defect database, indicating the same cause for the later defect, thereby enabling ready identification of the root causes of defects, and enabling early corrective action to be taken.

24 Claims, 12 Drawing Sheets

410 — SPHERICAL DIAMETER

| 430 → 1 | 2 | 3 | 4 |
|---|---|---|---|
| 420 → 0 - 1 μm | 1 - 2 μm | 2 - 3 μm | 3 - 4 μm |
|  | X |  |  |

FIG. 4A

| 450 DEFECT ID | PARTICLE/ PATTERN | SHAPE | SIZE | COMPOS. | ... | TOOL ID |
|---|---|---|---|---|---|---|
| 1 2 5 15...35 | 1 | 2 | 5 | 15 | ... | 35 |

DEFECT REFERENCE SYSTEM AUTOMATIC PATTERN CLASSIFICATION

This application claims benefit of Provisional application Ser. No. 60/144,129, filed Jul. 16, 1999.

FIELD OF THE INVENTION

The present invention relates to a method and apparatus for identifying the causes of inspected defects in a manufactured article. The invention has particular applicability for in-line inspection of semiconductor wafers during manufacture of high-density semiconductor devices with submicron design features.

BACKGROUND ART

Current demands for high density and performance associated with ultra large scale integration call for submicron features, increased transistor and circuit speeds and improved reliability. Such demands require formation of device features with high precision and uniformity, which in turn necessitates careful process monitoring, including frequent and detailed inspections of the devices while they are still in the form of semiconductor wafers.

Conventional wafer fabrication process control techniques employ wafer identification schemes, such as bar code labels, for in-process wafer tracking. After the completion of each process step (e.g., oxide growth, etch, clean, sputter, etc.), information related to the wafer lot and the "last visited tool"; i.e., the particular oven, etcher, cleaner, polishing machine, etc. used in processing the lot, is entered into a computer software-implemented database system known as a "manufacturing execution system" (MES). Such information includes wafer identification information, parameters related to the wafers, and process parameters used at the last visited tool. Thus, the MES tracks the completed process steps, the tools at which the process steps were performed, and the wafers on which the process steps were performed.

After the completion of a series of process steps, and/or after the completion of a critical process step, such as formation of a complex photoresist mask, a number of wafers in a lot are inspected, typically at a stand-alone inspection tool, per instructions from the MES. At the inspection tool, the surface of the wafer to be inspected is typically scanned by a high-speed inspection device; for example, an opto-electric converter such as a CCD (charge-coupled device), a scanning electron microscope (SEM) or a laser. Typically, the inspection tool informs the MES when it has completed its inspection. Statistical methods are thereafter employed by the inspection tool to produce a defect map showing suspected locations on the wafer having a high probability of a defect. If the number and/or density of the potential defects reach a predetermined level, an alarm is sounded, indicating that a more detailed look at the potential defect sites is warranted.

A review of the potential defect sites is then conducted using the defect map, either at the inspection tool or at a separate stand-alone review station, typically by comparing images of suspected defect sites with reference images to positively determine the presence of a defect, and then analyzing the images to determine the nature of the defect (e.g., a defective pattern, a particle, or a scratch). Common wafer inspection techniques used by wafer fabricators include light scattering techniques, optical techniques, SEM's and energy dispersive spectroscopy (EDS). Other well-known wafer inspection methods are also commonly employed, including atomic force microscopy (AFM), raman, ultrapoint, transmission electron microscopy (TEM), metapulse, photoluminescence and electron spectroscopy for chemical analysis (ESCA). Each of the foregoing methods furnishes different information relating to the defect; for example, AFM can reveal its size and shape, while EDS and ESCA can reveal its chemical composition.

In current "state of the art" wafer processing facilities, process data from the MES, and inspection and review results from the inspection tools and review stations are periodically downloaded to another stand-alone computer software-implemented system called a "yield management system" (YMS), which employs statistical process control methods to monitor process quality. If the YMS determines that the process is performing outside predetermined control limits, it generates data, such as a list of tools visited by wafers exhibiting defects and the process parameters used at those tools, which are helpful in diagnosing processing problems. The user may then analyze this data in an attempt to isolate the causes of the defects.

Disadvantageously, defects are not described in a standard way across the industry (i.e., defect descriptions differ between fabrication facilities within one device fabrication company, from one device fabricator to another, and between fabricators and equipment suppliers), thereby hindering attempts at defect identification and causal diagnoses. For example, one class of defects are called "fried egg" defects in Japan, but are called "space ship" defects by some fabricators in the United States. Thus, translation and exchange of information between fabricators and equipment suppliers of different cultures is made more difficult.

Moreover, even when defects are identified, they cannot be quickly or easily linked to a root cause. For example, although the YMS can identify the tools and process parameters of a process performing outside its control limits, the YMS cannot identify the most likely tool or process parameter at fault when a particular defect is detected. Still further, even if a particular tool is identified as the source of a defect, the YMS cannot link the defect with a particular fault in the tool, a material failure (i.e., a part failure) or a particular process condition.

There exists a need for a methodology for in-process inspection of semiconductor wafers that identifies defects in a standardized way. There further exists a need for an inspection methodology that relates the tools visited by the wafers and reliability information of those tools to detected defects in order to readily identify the root causes of defects, thereby enabling early corrective action to be taken. This need is becoming more critical as the density of surface features, die sizes, and number of layers in devices increase, requiring the number of defects to be drastically reduced to attain an acceptable manufacturing yield.

SUMMARY OF THE INVENTION

An advantage of the present invention is the ability to identify defects in a manufactured article, such as a semiconductor wafer, in a standardized qualitative manner, thereby allowing information relating to the defect to be easily linked to the defect, stored and searched. A further advantage of the present invention is the ability to include, in the identification of a defect, information relating to its cause, thereby enabling efficient identification of process problem areas, and the relation of defect causes to corrective action.

According to the present invention, the foregoing and other advantages are achieved in part by a method of classifying a feature of an article, which method comprises determining attributes of the feature; generalizing the attributes by associating each attribute with one or more categories, each category being a subset of one of a plurality of database objects associated with the attributes; assigning each category a symbol; arranging the symbols of the categories in a predetermined sequence to form an identifier for the feature; and storing the identifier in a database.

Another aspect of the present invention is a computer-readable medium bearing instructions for executing the above steps of the present methodology.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings-and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIG. 4A illustrates a database object and its subsets according to an embodiment of the present invention FIG. 4B illustrates the formation of a defect identifier according to the present invention.

DESCRIPTION OF THE INVENTION

Figure 1:
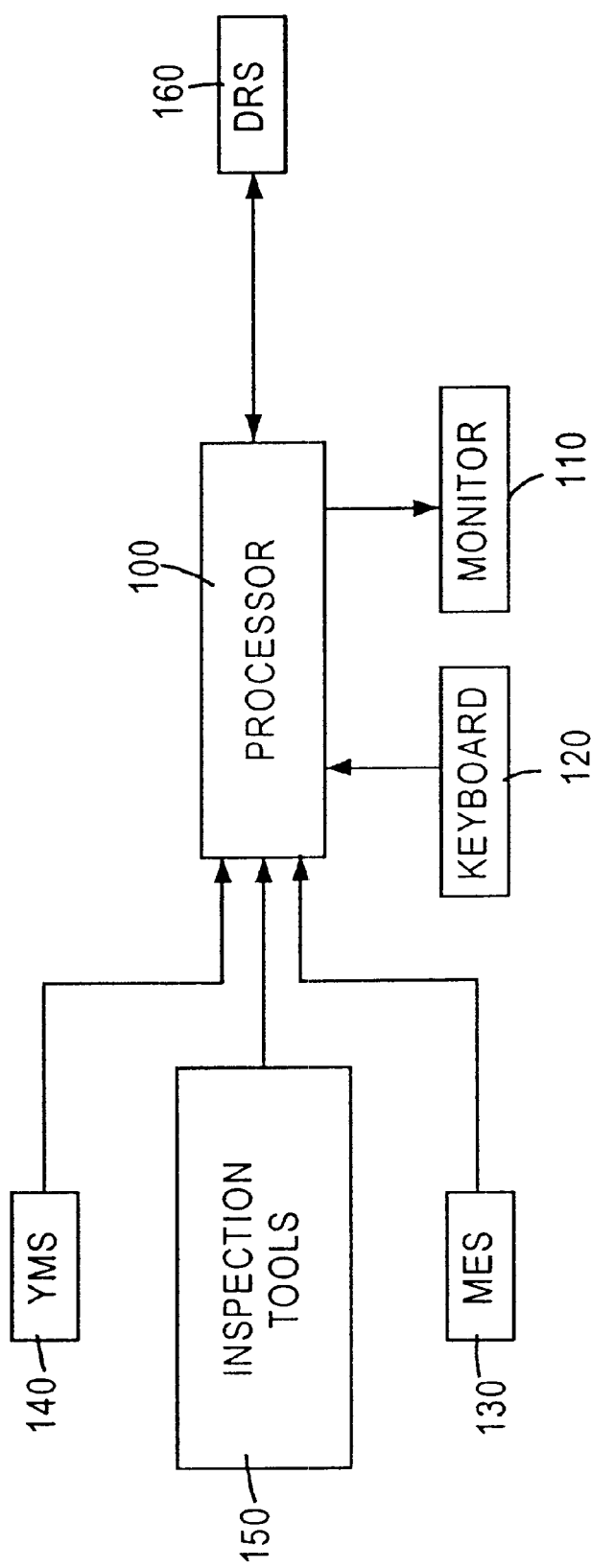
FIG. 1 schematically illustrates an apparatus used to implement the present invention.

While conventional methodologies for in-process inspection of manufactured articles, such as semiconductor wafers, identify defects, they do not identify the defects in a standardized, qualitative way, or provide information relating to the tools visited by the wafer that would lead to early positive identification of the defect sources. The present invention addresses these problems by qualitatively identifying defects with a string of symbols, such as numbers, according to relevant defect characteristics and information relating to the last-visited tool, including reliability information, thereby enabling ready identification of the root causes of defects, and enabling early corrective action to be taken.

According to certain embodiments of the present invention, after a defect on a wafer is discovered and inspected, as by optical review, SEM, EDS, AFM, etc., each quantitative attribute of the defect such as the defect's size, material composition, color, position on the surface of the wafer, etc. is generalized into a qualitative category and assigned a numerical symbol for identification. For example, a substantially round, approximately one-micron diameter particle composed of 79% aluminum is identified by a sequence of numbers in a predetermined order comprising a number representative of "aluminum" (the defect material), another number representative of "round" (the defect shape), and another number representative of a defect size range such as "a diameter less than two microns". Thus, every defect is identified by a mathematical description rather than by a visual pattern or verbal description. The identification sequences of all defects are stored in a database, where they are easily compared with other correspondingly identified defects.

Furthermore, in an embodiment of the present invention the identification sequence advantageously includes a number representative of the wafer's last-visited processing tool prior to inspection, thereby associating the defect with a tool. The defect is investigated and determined as being caused by a particular fault of the tool (e.g., the failure of a particular mechanical component or a particular processing phenomenon), and this information is stored and linked to the defect's identification sequence. Thereafter, if a similar defect occurs in another wafer, the later defect's identification sequence is matched to that of the previous defect by searching the defect database, indicating the same cause for the later defect, thereby facilitating investigation of the cause of the later defect.

Moreover, as the database expands with information relating to many defects and their causes, once a particular type of defect linked to a particular type of tool is identified, it is related to the cases of similar defects that have previously been investigated, dramatically decreasing the time and effort needed to trace the causes of defects. For example, if a round aluminum particle less than 2 microns in diameter is discovered after chemical vapor deposition (CVD) processing, and 9 out of 10 such defects in the database were caused in the past by arcing in the CVD chamber, it is very likely that arcing caused the latest defect. In this way, the present invention facilitates determination of the causes of defects and enables early corrective action to be taken; e.g., to distinguish between a catastrophic mechanical failure and one associated with a consumable or preventive maintenance item.

Still further, the present invention provides the statistical occurrence and probability of various root causes. For example, given a defect identification, the present invention can indicate that there is a 25% likelihood that the defect is caused by part XYZ, and a 75% likelihood that it is caused by process ABC. Additionally, once a root cause is selected, the present invention can furnish the probability of a given solution (e.g., Solution 1 has a 30% probability of solving the problem, Solution 2 has a 10% probability of solving the problem, while Solution 3 has a 60% probability of solving the problem).

An embodiment of the present invention is illustrated in FIGS. 1–4B. As shown in FIG. 1, the present invention is implemented at a processor 100, which preferably performs the analysis disclosed herein electronically, and input/output devices such a monitor 110 for displaying results of the analyses of processor 100, and a keyboard 120. Processor 100 is in communication with a conventional MES 130, a conventional YMS 140, and various conventional inspection tools 150. Inspection tools 150 can include an optical inspection tool, an SEM, as well as tools which perform EDS, AFM, ESCA, etc. as required by the user. A storage device 160, such as a server, stores the results of the calculations of processor 100, and is referred to as a "Defect Reference System" (DRS).

Figure 2:
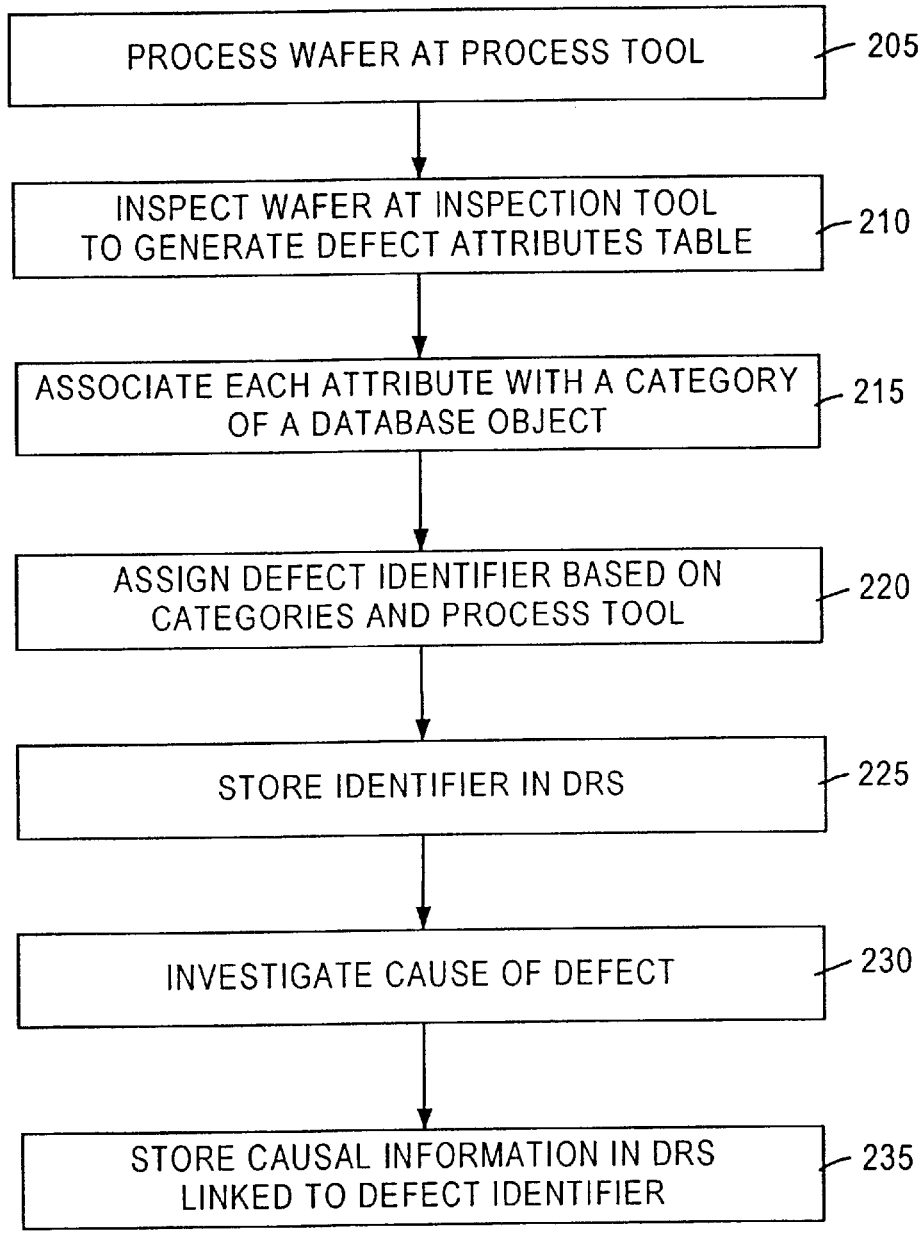
FIG. 2 is a flow chart illustrating sequential steps in a method according to an embodiment of the present invention.

Referring now to FIGS. 1 and 2, a semiconductor wafer is processed at a processing tool or series of tools at step 205 (FIG. 2). Typically, for each tool a tool identifier unique to the processing tool is stored in MES 130 (FIG. 1) along with a set of process parameters used at the tool. When it is determined (either manually by the user or automatically by MES 130) that no further processing steps are to be performed before inspection, the wafer is brought to inspection tools 150. At step 210, the wafer is inspected at inspection tools 150 as desired by the user to discover defects and determine "defect attributes"; that is, characteristics of the defects. For example, a conventional defect map is produced by an optical inspection tool, such as the WF-736, available from Applied Materials of Santa Clara, Calif., using statistical methods, typically involving algorithms and/or grey-scale analysis, to identify suspected locations on the inspected wafer having a high probability of having a defect. Then, redetection, analysis and classification of the defects are carried out on a review tool such as the SEMVision™ available from Applied Materials of Santa Clara, Calif., using conventional pattern recognition techniques or using an automated technique as described in copending U.S. patent application Ser. No. 09/111,454, filed Jul. 8, 1998, entitled "Automatic Defect Classification With Invariant Core Classes", the entire disclosure of which is hereby incorporated by reference.

Figure 3:
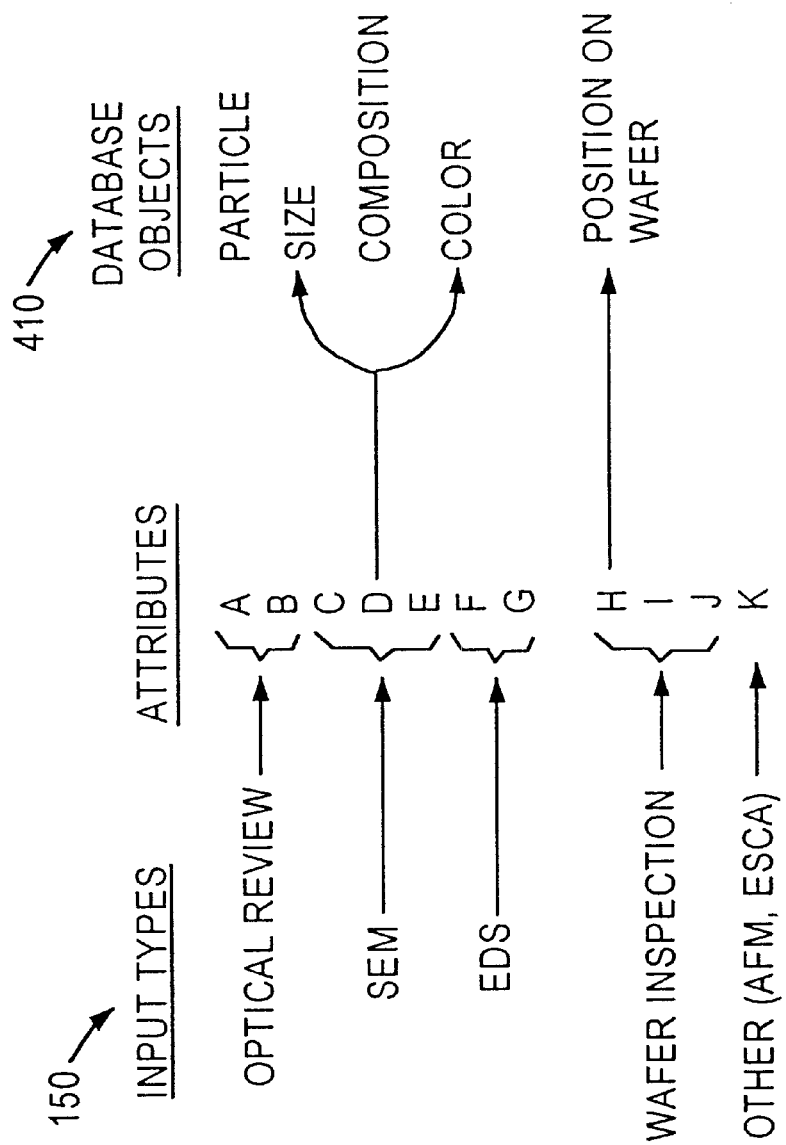
FIG. 3 is a conceptual flow chart illustrating the methodology of the present invention.

Inspection of the wafer at step 210 results in a "table" or list of defect attributes describing the defects, shown as A–K in the conceptual flow chart of FIG. 3. Each different wafer inspection tool 150 yields several defect attributes A–K. For example, defect attributes C–E of a particle-type defect obtained by SEM analysis include, for example, its position on the wafer, axial dimensions, shape, and whether it is embedded in the wafer or resting on the surface of the wafer, while EDS reveals the defect's chemical composition (i.e., attributes F and G). Furthermore, defect attributes A–K typically include data (i.e., attributes H–J) from the defect map produced at wafer inspection, such as the number of defects and the position of each defect on the wafer.

After the defect attributes have been determined, the attributes are "generalized" by expressing them qualitatively, rather than quantitatively. At step 215, each attribute is associated with at least one category that is a predetermined subset of a "database object" 410 (see FIGS. 3 and 4A). Database objects 410 include broad characterizations such as "particle", "size", "composition", "color", "position on the wafer", etc., while the categories or subsets 420 of the database objects 410 allow the defect attributes to be further classified and identified as having one or more of a limited number of specific characteristics determined to be significant by the user. In this way, defect information is standardized and simplified to facilitate subsequent searching of the data.

For example, a particle defect is placed in a category 420 called "particle on a pattern" or "particle embedded in a pattern" within a database object 410 called "particle". A particle having dimensions (i.e., attributes) of one micron wide and four microns long is categorized, for example, as an oval with a 4:1 axis ratio within the "shape" database object 410, while a spherical particle is categorized as a 1:1 axis ratio within this database object. Further, as shown in FIG. 4A, a spherical particle with a diameter of 1.5 micron is, for example, categorized as spherical with a diameter between one and two microns (see "x"). If it had a diameter of 2.3 microns, it would be categorized as spherical with a diameter between 2 and 3 microns. In the same way, a particle comprising stainless steel is categorized, for example, as comprising iron (Fe), chromium (Cr), nickel (Ni) and carbon (C), thereby generalizing from a metal alloy to its elements (FE, Cr, Ni, C). Alternatively, if more detail is desired by the user, a particle comprising stainless steel is categorized as comprising iron in a "primary composition" database object, and chromium, nickel and carbon in separate "secondary composition" database objects.

In other embodiments of the present invention, attributes of a plurality of defects are generalized into a subset category of a "pattern" database object 410 from a conventional defect map. Each defect site location from a conventional defect map is treated as an x and y coordinate attribute. The defect sites are tallied by their coordinates to populate predefined "sectors" which define discrete areas on the wafer. Patterns are defined from the sector population, thereby describing the population mathematically. The methodology of this embodiment of the present invention facilitate fat and accurate pattern determination and requires no user judgement.

Figure 5A:
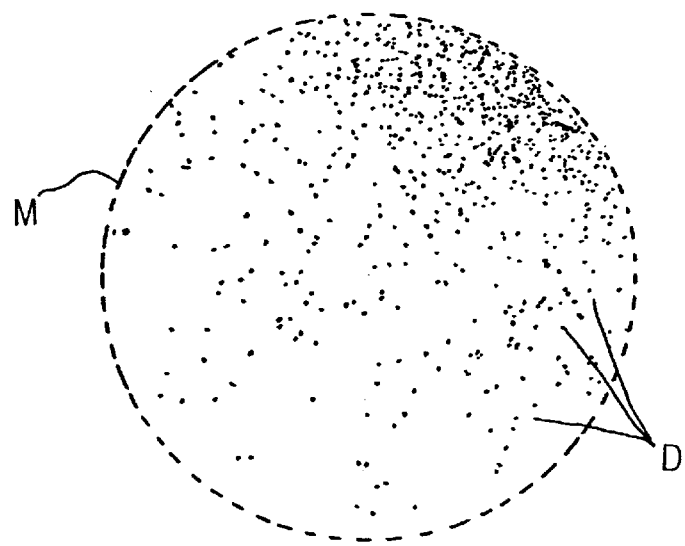
FIG. 5A illustrates a conventional defect map produced by an inspection tool.
Figure 5B:
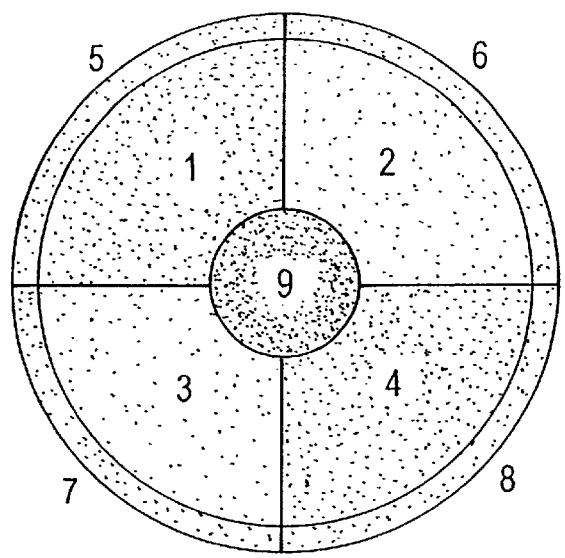
FIG. 5B illustrates the division of the surface of a semiconductor wafer according to an embodiment of the present invention.
Figure 6:
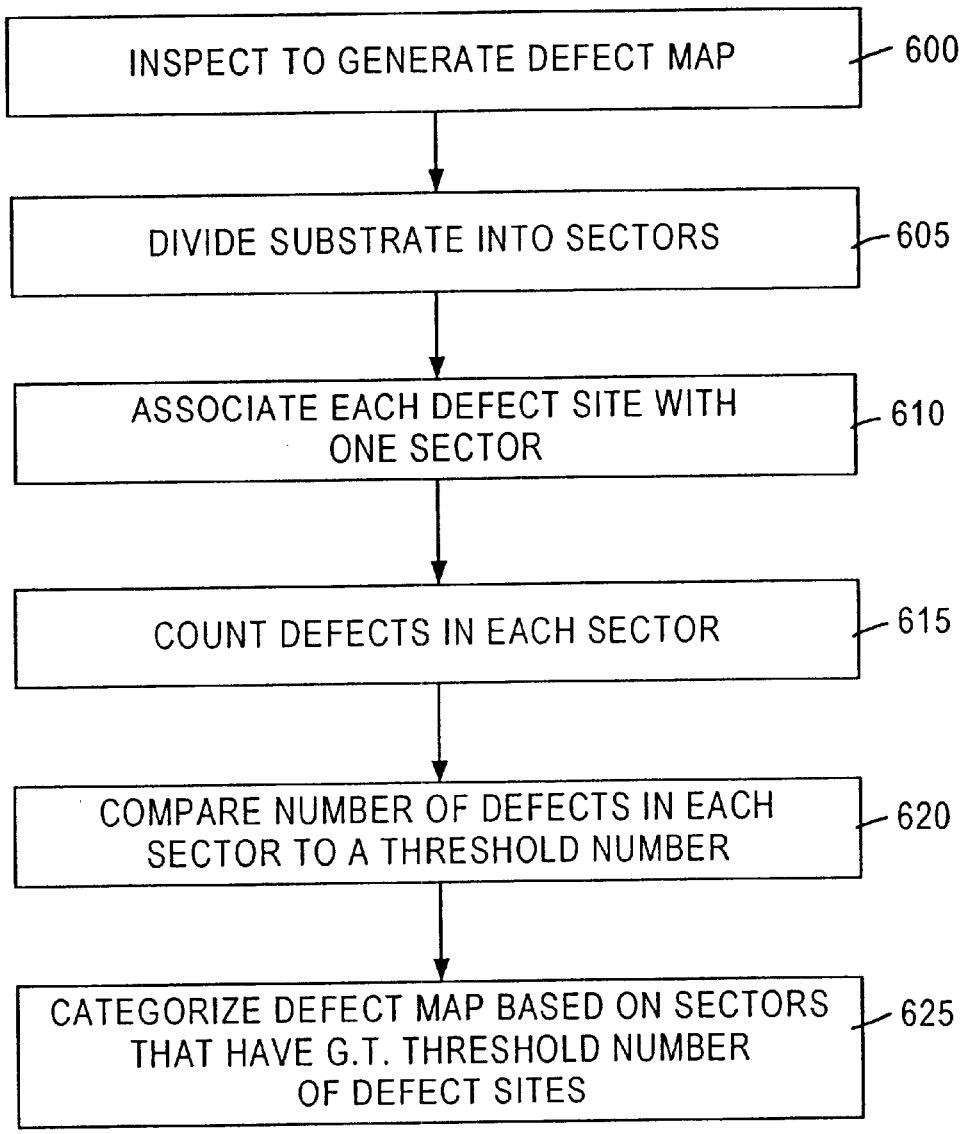
FIG. 6 is a flow chart illustrating sequential steps in a method according to another embodiment of the present invention.

Referring to FIGS. 5A and 5B and the flow chart of FIG. 6, a wafer is inspected in a conventional manner, typically at an optical inspection tool, to produce a defect map M having suspected defect sites D at step 600. At step 605, the wafer surface is divided into sectors, such as sectors 1–9 in FIG. 5B, which correspond to expected significant defect areas. At step 610, each defect site D is associated with one of the sectors 1–9, and a count of the number of defect sites in each sector is determined at step 615. Next, the number of defect sites in each sector 1–9 is compared to a predetermined threshold number (see step 620) or standard deviation. Then, at step 625, the defect map is treated as a defect attribute and is generalized into a subset category of a pattern database object based on the sectors 1–9 that have greater than the threshold number of defect sites.

For example, a pattern database object having 9 factorial (9!) subset categories based on sectors 1–9 of FIG. 5B is created. If the predetermined threshold number of defects sites for each sector is 25, then the defect map M of FIG. 5A is generalized as being in the category reflecting that sectors 2 and 6 contain many defect sites.

Figure 7A:
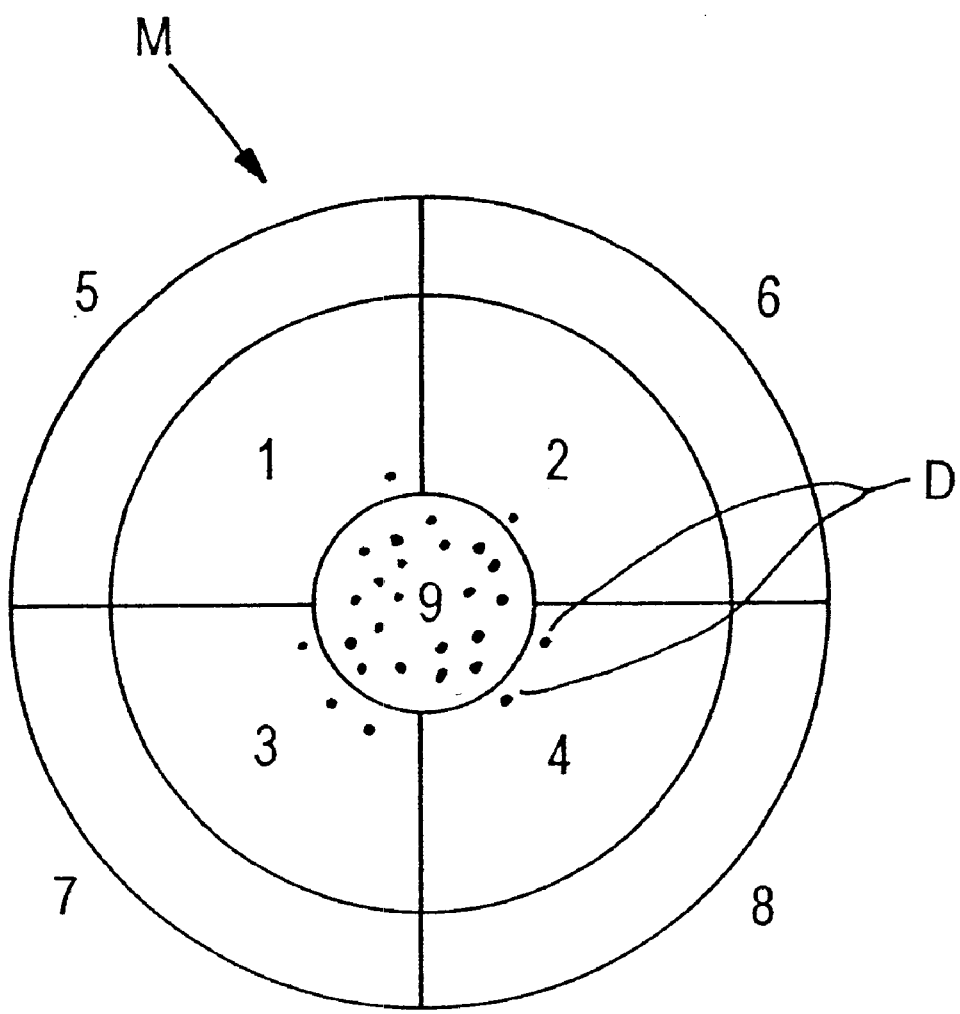
FIGS. 7A–7D schematically illustrate defect analysis according to embodiments of the present invention.
Figure 7B:
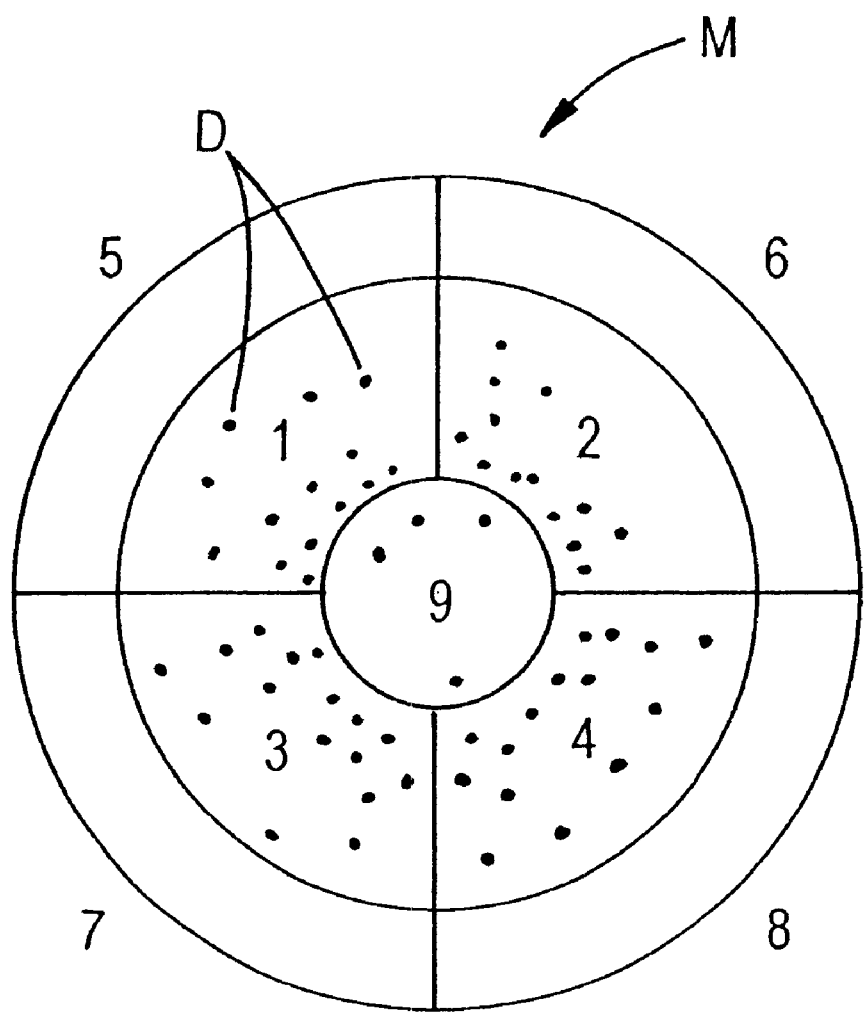
Figure 7C:
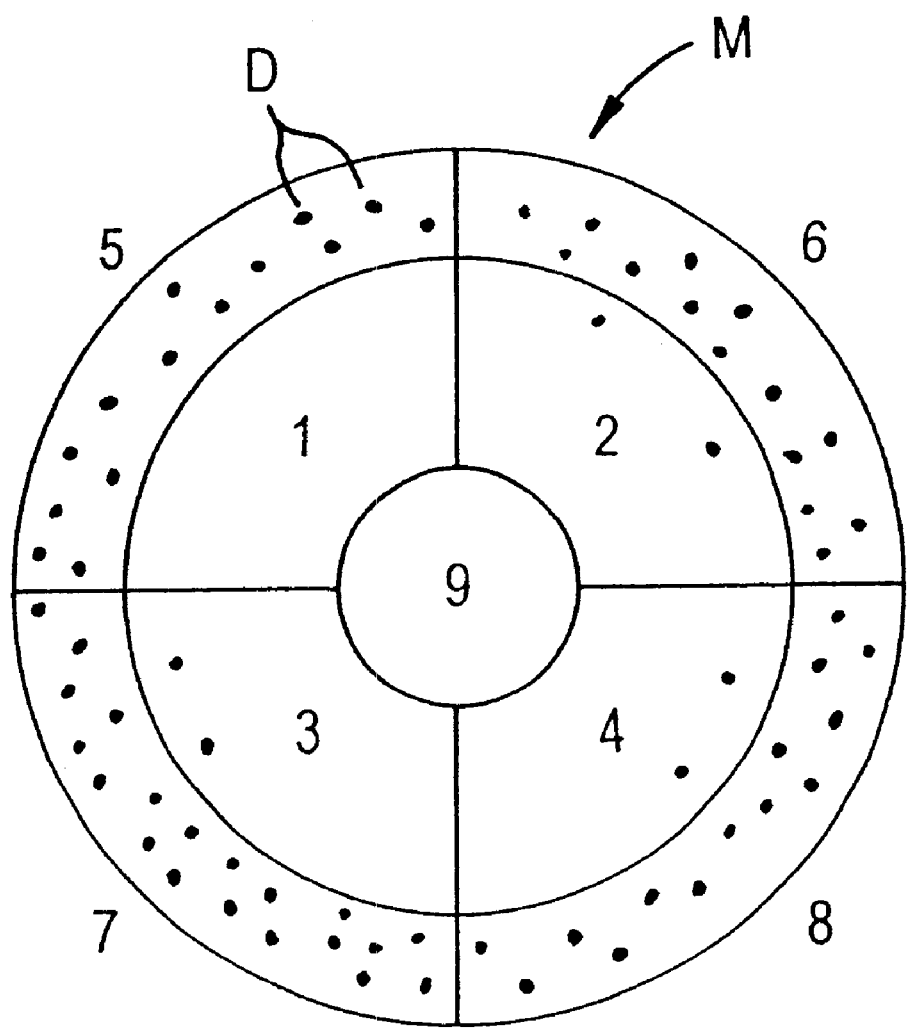

In another embodiment of the present invention wherein defect sites D of a defect map M are associated with predetermined sectors, such as sectors 1–9 of a wafer surface, a pattern database object has predetermined shape category subsets corresponding to expected significant defect site distributions. Referring now to FIG. 7A, when a significant number of defect sites are found in sector 9, the defect map is placed in a "defects at center" pattern category. In the defect map of FIG. 7B, defect sites are concentrated in sectors 1–4, so this defect map is placed in a "doughnut" shape pattern category. The doughnut shape pattern is significant because it may indicate problems with a tool, such as a vacuum chuck, visited by the wafer. FIG. 7C illustrates defect sites concentrated in sectors 5–8, as may be caused by a clamp ring, so this defect map is placed in a "ring" or "outer edge" shape pattern category.

Alternatively, conventional spatial signature analysis (SSA) can be used to analyze a pattern of defect sites, typically employing information from YMS 140. The results of SSA are then treated as another defect attribute and generalized into an appropriate subset category or categories of a pattern database object.

Figure 7D:
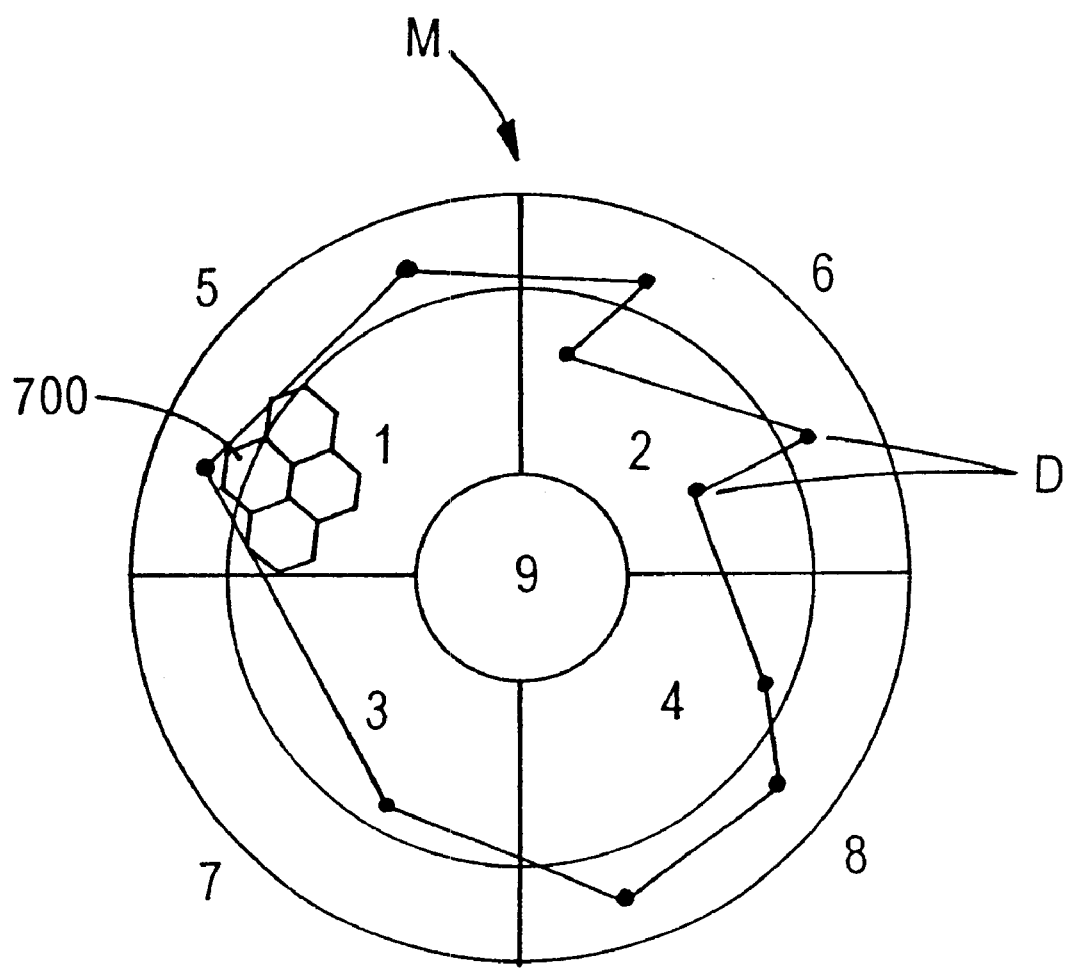

In still another embodiment of the present invention, as illustrated in FIG. 7D, when defect sites D of a defect map M form a random pattern, a pattern database object having predetermined fractal number subsets is used. In this embodiment, the pattern of defect sites is expressed mathematically using a conventional fractal software program, such as is available from the National Bureau of Standards. Typically, in fractal techniques, shapes of small dimensions, such as small hexagons 700, are used to fill the space within a pattern, such as within a random pattern of defect sites D. The number of hexagons 700 needed to fill the space is the pattern's "fractal number". Thus, a random pattern of defect sites is generalized by placing it into a category corresponding to its fractal number.

When each defect attribute A–K is associated with a category 420 of a database object 410 at step 215, each category of each database object is preassigned a symbol, preferably an integer or integers. This is illustrated in FIG. 4A, wherein a numerical symbol 430 is associated with each category 420 of a database object 410. The "x" represents a defect attribute that has been categorized. At step 220, after all the attributes of a defect are categorized, the defect is assigned an identifier formed by arranging, in a predetermined sequence, the symbols 430 of the categories 420 into which the defect's attributes have been placed (see FIG. 4B). Preferably, the processing tool visited by the wafer prior to inspection is also assigned an identifying symbol 440, which is also included in the defect identifier 450 in a predetermined position in the sequence. As shown in FIG. 4B, database objects 410 are arranged in a predetermined sequence, and category symbols 430 of the attributes of a defect are strung together to form a defect identifier 450 (i.e., 12515 . . . 35).

Next, at step 225, defect identifier 450 is stored in DRS 160. At this point, the cause of the defect is investigated and determined using known techniques (see step 230), and pertinent causal information (e.g., a specific mechanical failure in the last-visited tool) stored, as in DRS 160, linked to defect identifier 450 at step 235. In a further embodiment of the present invention, process parameters stored in MES 130 and data from YMS 140 are also linked to defect identifier 450. As a result, an extensive amount of defect information is available to the user based on defect identifier 450. After steps 205–235 have been repeated for a plurality of defects, thereby building a defect identifier database in DRS 160, the determination of defect causation is facilitated by searching DRS 160 based on all or part of a defect identifier 450 of a subsequently detected defect processed using the present methodology.

Figure 8:
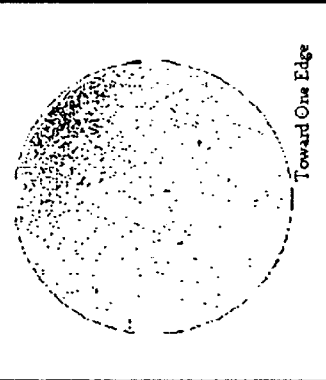
FIG. 8 illustrates the displayed results of a defect analysis according to the methodology of the present invention.

An example of the information yielded by such a search is illustrated in FIG. 8, and is displayed, such as at monitor 110, for the benefit of the user. The user requests a search based on all or part of a defect identifier; for example, the user requests to view data relating to particles containing fluorine, or linked to a particular tool. At panel 810, information relating to the defect origin is presented, such as the symptom of the problem, the tools involved ("Platform" and "Chamber/Process"), and the maintenance history of the tool. This information is gathered, for example, from MES 130 and YMS 140. At panels 820–840, defect attributes, as from inspection tools 150, are presented as desired by the user. Panel 850 presents causal information gathered from prior investigation. Panels 860 and 870 illustrate information linked to causal information 850, such as recommended corrective action and tool repair information. Panel 880 shows similar cases and their causes, and the resulting confidence level in the diagnosis of panel 850.

Figure 9:
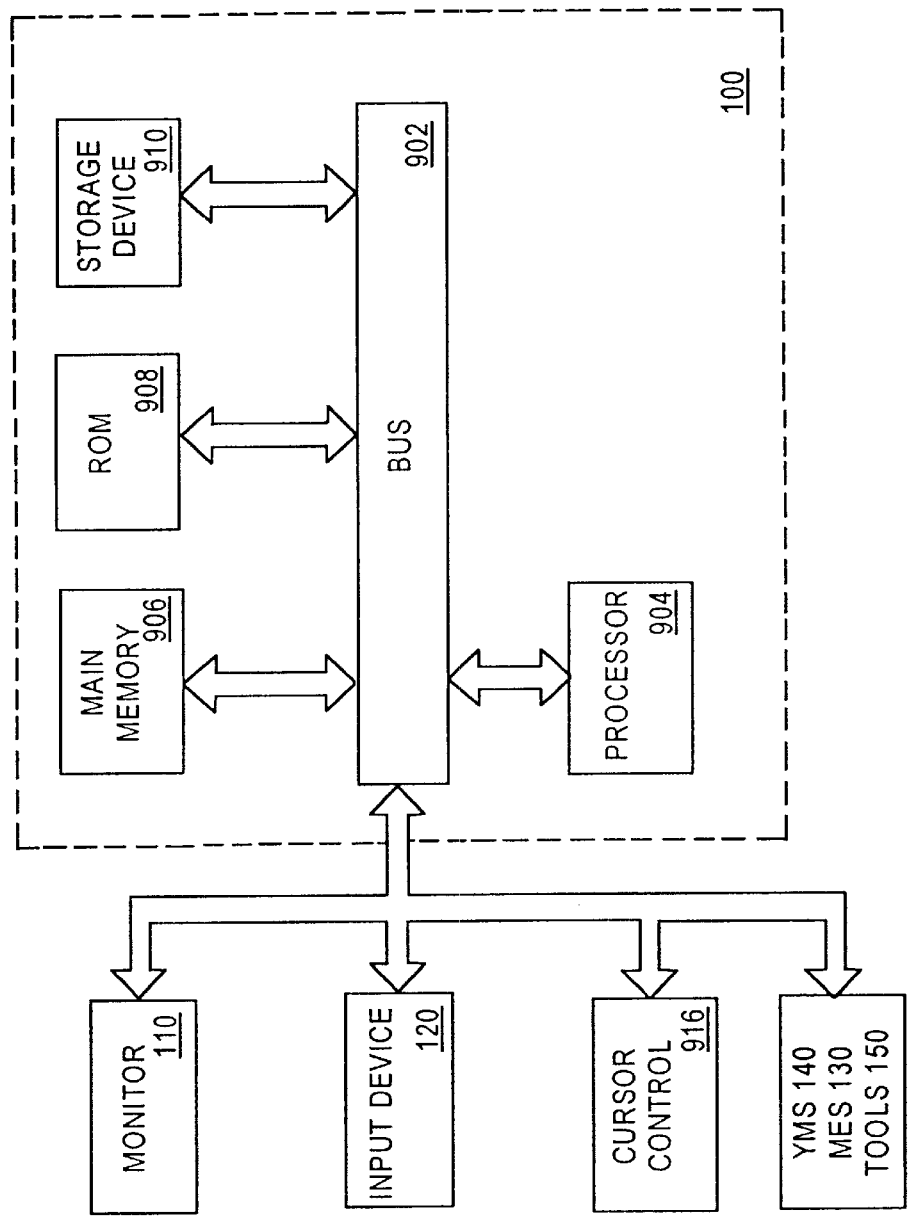
FIG. 9 is a block diagram that illustrates an embodiment of the present invention.

FIG. 9 is a block diagram that illustrates an embodiment of the invention shown in FIG. 1. According to this embodiment, processor 100, as shown in FIG. 1, includes a bus 902 or other communication mechanism for communicating information, and a central processing unit (CPU) 904 coupled with bus 902 for processing information. Processor 100 also includes a main memory 906, such as a random access memory (RAM) or other dynamic storage device, coupled to bus 902 for storing information and instructions to be executed by CPU 904. Main memory 906 also may be used for storing temporary variables or other intermediate information during execution of instructions to be executed by CPU 904. Processor 100 further includes a read only memory (ROM) 908 or other static storage device coupled to bus 902 for storing static information and instructions for CPU 904. A storage device 910, such as a magnetic disk or optical disk, is provided and coupled to bus 902 for storing information and instructions. For example, storage device 910 may include DRS 160 of FIG. 1.

Processor 100 is coupled. as via bus 902, to monitor 110 (FIG. 1), such as a cathode ray tube (CRT), for displaying information to the user. An input device, such as keyboard 120, including alphanumeric and other keys, is coupled to bus 902 for communicating information and command selections to CPU 904. Another type of user input device is cursor control 916, such as a mouse, a trackball, or cursor direction keys for communicating direction information and command selections to CPU 904 and for controlling cursor movement on monitor 110.

MES 130, YMS 140 and inspection tools 150 (FIG. 1) input data relating to a semiconductor wafer under inspection, as discussed above, to bus 902. Such data may be stored in main memory 906 and/or storage device 910, and used by CPU 904 as it executes instructions.

The invention is related to the use of processor 100 for analysis of defects on the surface of a semiconductor wafer. According to an embodiment of the invention, defect analysis is provided by processor 100 in response to CPU 904 executing one or more sequences of one or more instructions contained in main memory 906. Such instructions may be read into main memory 906 from another computer-readable medium, such as storage device 910. Execution of the sequences of instructions contained in main memory 906 causes CPU 904 to perform the process steps described above. One or more processors in a multi-processing arrangement may also be employed to execute the sequences of instructions contained in main memory 906. In alternative embodiments, hard-wired circuitry may be used in place of or in combination with software instructions to implement the invention. Thus, embodiments of the invention are not limited to any specific combination of hardware circuitry and software. The programming of the apparatus is readily accomplished by one of ordinary skill in the art provided with the flow charts of FIG. 2 and FIG. 6.

The term "computer-readable medium" as used herein refers to any medium that participates in providing instructions to CPU 904 for execution. Such a medium may take many forms, including but not limited to, non-volatile media, volatile media, and transmission media. Non-volatile media include, for example, optical or magnetic disks, such as storage device 910. Volatile media include dynamic memory, such as main memory 906. Transmission media include coaxial cable, copper wire and fiber optics, including the wires that comprise bus 902. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer-readable media may be involved in carrying out one or more sequences of one or more instructions to CPU 904 for execution. For example, the instructions may initially be borne on a magnetic disk of a remote computer. The remote computer can load the instructions into its dynamic memory and send the instructions over a telephone line using a modem. A modem local to processor 100 can receive the data on the telephone line and use an infrared transmitter to convert the data to an infrared signal. An infrared detector coupled to bus 902 can receive the data carried in the infrared signal and place the data on bus 902. Bus 902 carries the data to main memory 906, from which CPU 904 retrieves and executes the instructions. The instructions received by main memory 906 may optionally be stored on storage device 910 either before or after execution by CPU 904.

The inventive methodology provides for in-process inspection of semiconductor wafers that quickly identifies defects in a standardized way using information gathered by conventional inspection techniques. Furthermore, the present invention relates the process tools visited by the wafers and reliability information of those tools to detected defects in order to readily identify the root causes of defects, thereby enabling early corrective action to be taken. Thus, the present invention contributes to the maintenance of high production throughput and increases manufacturing yield as design rules shrink. The present invention is applicable to the inspection of any semiconductor wafer, and is especially useful for in-process inspection of semiconductor wafers during manufacture of high density semiconductor devices with submicron design features.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of classifying a feature of an article, which method comprises:

(a) determining attributes of the feature;

(b) generalizing the attributes by associating each attribute with one or more categories, each category being a subset of one of a plurality of database objects associated with the attributes;

(c) assigning each category a symbol;

(d) arranging the symbols of the categories in a predetermined sequence to form an identifier for the feature; and (e) storing the identifier in a database.

2. The method according to claim 1, comprising inspecting the article using an inspection tool to determine the attributes.

3. The method of claim 2, comprising:

performing a processing step on the article using a processing tool prior to inspecting the article;

assigning the processing tool one of the symbols as an identifier for the processing tool; and including the processing tool symbol in the sequence.

4. The method of claim 3, wherein the processing step is performed using a set of process parameters, the method comprising:

storing the process parameters; and linking the process parameters and the identifier.

5. The method according to claim 1, wherein the feature comprises a plurality of defects on a surface of the article, the method comprising generalizing the plurality of defects as a pattern database object having a predetermined shape category subset.

6. The method according to claim 1, wherein the feature comprises a plurality of defects on a surface of the article, the method comprising generalizing the plurality of defects as a pattern database object having a predetermined location on the surface of the article category subset.

7. The method according to claim 2, wherein the article is a semiconductor substrate and the feature comprises a plurality of defects on a surface of the semiconductor substrate, the method comprising inspecting the article using at least one of an optical inspection station, a wafer inspection station, a scanning electron microscope (SEM), an atomic force microscope (AFM), energy dispersive spectroscopy (EDS), or electron spectroscopy for chemical analysis (ESCA).

8. The method according to claim 1, wherein the article is a semiconductor substrate and the feature comprises a plurality of defects on a surface of the semiconductor substrate, the method comprising:

inspecting the article to produce a defect map of a plurality of defects, such that the attributes of each defect comprise a set of coordinates corresponding to its location on a surface of the substrate;

dividing the substrate into sectors;

associating each defect with one of the sectors based on its coordinates;

counting the defects in each sector;

comparing the number of defects in each sector to a predetermined threshold number; and associating the defects in a first one of the sectors with a category of a pattern database object that includes the first sector, when the number of defects in the first sector is greater than or equal to the predetermined threshold number.

9. The method according to claim 1, wherein the feature comprises a plurality of defects, the method comprising generalizing the plurality of defects as a pattern database object having a predetermined fractal number subset.

10. The method according to claim 1, wherein the symbols are integers.

11. The method according to claim 3, wherein the feature comprises a defect in the article, the method comprising:
   determining a cause of the defect, the cause being related to the processing tool; and
   linking the cause and the identifier.

12. The method of claim 1, comprising:
   repeating steps (a)–(e) for a plurality of features; and
   searching for corresponding identifiers based on one or more corresponding symbols of the identifiers in the database.

13. A computer-readable medium bearing instructions for classifying a feature of an article, said instructions, when executed, being arranged to cause one or more processors to perform the steps of:
   (a) receiving attributes of the feature;
   (b) generalizing the attributes by associating each attribute with one or more categories, each category being a subset of one of a plurality of database objects associated with the attributes;
   (c) assigning each category a symbol;
   (d) arranging the symbols of the categories in a predetermined sequence to form an identifier for the feature; and
   (e) storing the identifier in a database.

14. The computer-readable medium according to claim 13, wherein the article is inspected using an inspection tool, wherein the instructions, when executed, are arranged to cause the one or more processors to perform the step of receiving the feature attributes from the inspection tool.

15. The computer-readable medium according to claim 14, wherein a processing step is performed on the article using a processing tool prior to inspecting the article, wherein the instructions, when executed are arranged to cause the one or more processors to perform the steps of:
   assigning the processing tool one of the symbols as an identifier for the processing tool; and
   including the processing tool symbol in the sequence.

16. The computer-readable medium according to claim 15, wherein the processing step is performed using a set of stored process parameters, and wherein the instructions, when executed, are arranged to cause the one or more processors to perform the step of linking the process parameters and the identifier.

17. The computer-readable medium according to claim 13, wherein the feature comprises a plurality of defects on a surface of the article, wherein the instructions, when executed, are arranged to cause the one or more processors to perform the step of generalizing the plurality of defects as a pattern database object having a predetermined shape category subset.

18. The computer-readable medium according to claim 13, wherein the feature comprises a plurality of defects on a surface of the article, wherein the instructions, when executed, are arranged to cause the one or more processors to perform the step of generalizing the plurality of defects as a pattern database object having a predetermined location on the surface category subset.

19. The computer-readable medium according to claim 14, wherein the article is a semiconductor substrate and the feature comprises a plurality of defects on a surface of the semiconductor substrate, wherein the instructions, when executed, are arranged to cause the one or more processors to perform the step of receiving the feature attributes from at least one of an optical inspection station, a wafer inspection station, a scanning electron microscope (SEM), an atomic force microscope (AFM), energy dispersive spectroscopy (EDS), or electron spectroscopy for chemical analysis (ESCA).

20. The computer-readable medium according to claim 14, wherein the article is a semiconductor substrate and the feature comprises a plurality of defects on a surface of the semiconductor substrate, wherein the instructions, when executed, are arranged to cause the one or more processors to perform the steps of:
   receiving a defect map of a plurality of defects from the inspection tool, such that the attributes of each defect comprise a set of coordinates corresponding to its location on a surface of the substrate;
   dividing the substrate into sectors;
   associating each defect with one of the sectors based on its coordinates;
   counting the defects in each sector;
   comparing the number of defects in each sector to a predetermined threshold number; and
   associating the defects in a first one of the sectors with a category of a pattern database object that includes the first sector, when the number of defects in the first sector is greater than or equal to the predetermined threshold number.

21. The computer-readable medium according to claim 13, wherein the feature comprises a plurality of defects on a surface of the article, wherein the instructions, when executed, are arranged to cause the one or more processors to perform the step of generalizing the plurality of defects as a pattern database object having a predetermined fractal number subset.

22. The computer-readable medium according to claim 13, wherein the instructions, when executed, are arranged to cause the one or more processors to perform the step of assigning integers as the symbols.

23. The computer-readable medium according to claim 15, wherein the feature comprises a defect in the article, wherein a cause of the defect is determined and stored, wherein the cause is related to the processing tool, and wherein the instructions, when executed, are arranged to cause the one or more processors to perform the step of linking the cause and the identifier.

24. The computer-readable medium according to claim 13, wherein the instructions, when executed, are arranged to cause the one or more processors to perform the steps of:
   repeating steps (a)–(e) for a plurality of features; and
   searching for corresponding identifiers based on one or more corresponding symbols of the identifiers in the database.

* * * * *